United States Patent
Lee et al.

(10) Patent No.: US 9,574,125 B2
(45) Date of Patent: Feb. 21, 2017

(54) COMPOSITE GRAPHITE HEAT INSULATING MATERIAL CONTAINING HIGH-DENSITY COMPRESSED AND EXPANDED GRAPHITE PARTICLES AND METHOD FOR MANUFACTURING SAME

(71) Applicant: GTS CO., LTD., Gyeonggi-do (KR)

(72) Inventors: Su-Han Lee, Gyeonggi-do (KR); Duk-Joon Jung, Gyeonggi-do (KR)

(73) Assignee: GTS CO., LTD., Gyeonggi-do (KR)

( * ) Notice: Subject to any disclaimer, the term of this patent is extended or adjusted under 35 U.S.C. 154(b) by 0 days.

(21) Appl. No.: 14/894,892

(22) PCT Filed: May 29, 2014

(86) PCT No.: PCT/KR2014/004815
§ 371 (c)(1),
(2) Date: Nov. 30, 2015

(87) PCT Pub. No.: WO2014/193180
PCT Pub. Date: Dec. 4, 2014

(65) Prior Publication Data
US 2016/0115363 A1    Apr. 28, 2016

(30) Foreign Application Priority Data
May 29, 2013 (KR) ........................ 10-2013-0061217

(51) Int. Cl.
*C09K 5/14* (2006.01)
*C01B 31/04* (2006.01)
(Continued)

(52) U.S. Cl.
CPC ............. *C09K 5/14* (2013.01); *C01B 31/0423* (2013.01); *H01L 23/373* (2013.01); *H01L 23/42* (2013.01)

(58) Field of Classification Search
None
See application file for complete search history.

(56) References Cited

U.S. PATENT DOCUMENTS

| | | | |
|---|---|---|---|
| 6,790,390 B2 | 9/2004 | Py et al. | 264/29.1 |
| 2013/0260150 A1* | 10/2013 | Grivei | C01B 31/04 |
| | | | 428/402 |

(Continued)

FOREIGN PATENT DOCUMENTS

| | | | | |
|---|---|---|---|---|
| JP | 2006-328143 | 12/2006 | | C09K 5/06 |
| KR | 10-2002-0092940 | 12/2002 | | C04B 35/536 |

(Continued)

OTHER PUBLICATIONS

ISR Dated Sep. 16, 2014 in PCT/KR2014/004815 published as WO 2014/193180.

(Continued)

*Primary Examiner* — Necholus Ogden, Jr.
(74) *Attorney, Agent, or Firm* — Harness, Dickey & Pierce, P.L.C.

(57) ABSTRACT

Disclosed are a composite graphite heat insulating material with improved thermal conductivity in the thickness direction and a method for manufacturing the same. The composite graphite heat insulating material according to the present invention comprises: an expanded graphite matrix which is compressed in the thickness direction; and high-density compressed and expanded graphite particles which are filled in the pores within the compressed and expanded graphite matrix and have a density of 0.1 g/cm$^3$ or more.

3 Claims, 3 Drawing Sheets

(51) Int. Cl.
*H01L 23/373* (2006.01)
*H01L 23/42* (2006.01)

(56) References Cited

U.S. PATENT DOCUMENTS

| | | | |
|---|---|---|---|
| 2013/0273349 A1 | 10/2013 | Choi et al. | ............... C09K 5/14 |
| 2014/0190676 A1* | 7/2014 | Zhamu | ................... F28F 21/02 |
| | | | 165/185 |

FOREIGN PATENT DOCUMENTS

| | | | | |
|---|---|---|---|---|
| KR | 10-0755014 | 8/2007 | ............ | C09J 133/06 |
| KR | 10-0971780 | 7/2010 | ............... | C09K 5/00 |
| KR | 10-2012-0074694 | 7/2012 | ............... | C01B 31/04 |
| KR | 10-2013-0028281 | 3/2013 | ............... | C09K 5/14 |

OTHER PUBLICATIONS

Office Action, dated Oct. 22, 2013 issued by the Korean Intellectual Property Office in KR10-2013-0061217 and English translation thereof.
Patented claims in KR10-2013-0061217 and English translation thereof.

* cited by examiner

Heat Source (Left)   Heat Source with Heat-emitting Material (Right)

COMPOSITE GRAPHITE HEAT INSULATING MATERIAL CONTAINING HIGH-DENSITY COMPRESSED AND EXPANDED GRAPHITE PARTICLES AND METHOD FOR MANUFACTURING SAME

CROSS-REFERENCE TO RELATED APPLICATIONS

This application is a national phase application of PCT Application No. PCT/KR2014/004815, filed on 29 May 2014, which claims benefit of Korean Patent Application 10-2013-0061217, filed on 29 May 2013. The entire disclosures of the applications identified in this paragraph are incorporated herein by reference.

FIELD

The present disclosure relates to a technique for preparing a graphite-based heat-emitting material, more specifically a composite graphite heat emitting material comprising expanded and compressed graphite particles with a high density, and a method for preparing the heat-emitting material.

BACKGROUND

An integrated circuit or a light emitting display has been used in various electronics including computers, notebooks, tablet PCs, cell phones and display panels, and generates a lot of heat during its operation.

Such a heat should be emitted to the outside through a suitably emitting means. Otherwise, the electronics may undergo the deterioration of reliability and durability by excessive temperature rise.

As an emitting material, metals or graphite having good thermal conductivity have been used. Among these, the graphite is favorable in term of weight lightening and coast saving as the emitting material for various products.

Generally, heat-emitting materials comprising graphite have been obtained in the form of a sheet or a gasket by bringing exfoliated natural graphite itself into compression molding.

However, as the compressed natural graphite is anisotropic, it has very high thermal conductivity in the direction of its plane but exhibits insufficient thermal conductivity in the direction of its thickness.

Korean Patent No. 10-0755014 (registered on Aug. 28, 2007) discloses a heat-emitting graphite sheet coated with a thermal conductive adhesive and a preparation thereof.

DISCLOSURE

Technical Problem

The present disclosure is designed to solve the problems of the related art, and therefore the present disclosure is directed to providing a graphite-based heat-emitting material which has enhanced thermal conductivity in the direction of thickness as well as high thermal conductivity in the direction of plane, thereby exhibiting the overall rise in thermal conductive characteristics.

Technical Solution

In one aspect of the present disclosure, there is provided a composite graphite for preparing a heat-emitting material, in which expanded graphite is mixed with expanded and compressed graphite particles with a high density of 0.1 $g/cm^3$ or more.

In the composite graphite, the expanded and compressed graphite particles have a density of 0.1 to 2.2 $g/cm^3$.

Also, in the composite graphite, the high-density expanded and compressed graphite particles are present in an amount of 5 to 50 wt % based on the total weight of the expanded graphite and the high-density expanded and compressed graphite particles.

In addition, in the composite graphite, the high-density expanded and compressed graphite particles have a diameter of 0.01 to 0.2 μm.

In another aspect of the present disclosure, there is also provided a method for preparing a composite graphite heat emitting material, comprising (a) compressing expanded graphite to obtain high density expanded and compressed graphite particles with a density of 0.1 $g/cm^3$ or more; (b) mixing another expanded graphite with the high-density expanded and compressed graphite particles to obtain a composite graphite; and (c) bringing the composite graphite into compression molding. The compression molding may be carried out by way of rolling.

In still another aspect of the present disclosure, there is also provided a composite graphite heat emitting material, comprising a matrix of expanded graphite being compressed in the direction of thickness; and expanded and compressed graphite particles charged into pores in the matrix and having a high density of 0.1 $g/cm^3$ or more.

In yet still another aspect of the present disclosure, there is also provided a composite graphite heat emitting material, comprising a matrix of expanded graphite being compressed in the direction of thickness; and high density expanded and compressed graphite particles charged into pores in the matrix and having a density of 0.1 to 2.2 $g/cm^3$, wherein the high-density expanded and compressed graphite particles are present in an amount of 5 to 50 wt % based on the total weight of the expanded graphite matrix and the high-density expanded and compressed graphite particles.

In addition, the high-density expanded and compressed graphite particles have a diameter of 0.01 to 0.2 μm.

Advantageous Effects

The composite graphite heat emitting material according to the present disclosure, in which pores in a matrix of expanded and compressed graphite is filled with the same graphite material component being expanded and compressed to a high density, can surprisingly enhance thermal conductivity in the direction of thickness and eventually a high level of heat-emitting property.

Therefore, the graphite heat-emitting material of the present invention can quickly conduct heat transferred through an exothermic plane of electronics into both direction of their plane and thickness, thereby providing good heat-emitting effects.

DESCRIPTION OF DRAWINGS

Other objects and aspects of the present disclosure will become apparent from the following descriptions of the embodiments with reference to the accompanying drawings in which.

BEST MODE

Figure 1:
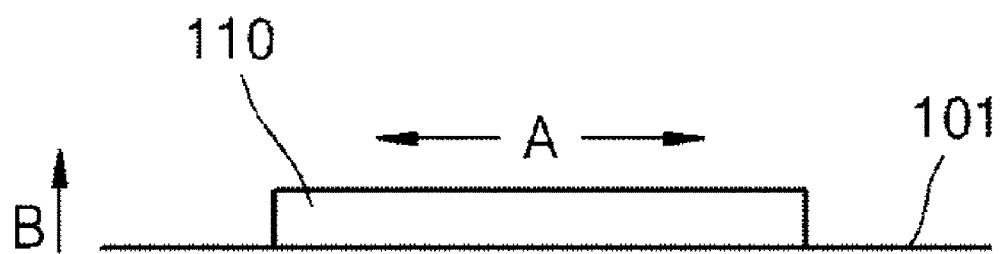
FIG. 1 shows the case that a composite graphite heat emitting material according to one embodiment of the present disclosure is attached to an exothermic plane.

The advantages and features of the present disclosure would be apparent from embodiments which will be described below, in addition to the accompanying drawings. However, the embodiments are not intended to limit the present invention and given by way of illustration only for the purpose of better understanding of the invention to a person having ordinary skill in the art, and also other equivalents and modifications could be made thereto. Therefore, it should be understood that the present invention is defined by the scope of the claims. The same reference numerals indicate the same components throughout the specification.

Hereinafter, the heat-emitting material of a composite graphite comprising high-density expanded and compressed graphite and the preparation thereof according to preferred embodiments of the present disclosure will be described in detail with reference to the accompanying drawings.

FIG. 1 shows the case that a composite graphite heat emitting material according to one embodiment of the present disclosure is attached to an exothermic plane.

Referring to FIG. 1, the composite graphite heat emitting material 110 according to the present disclosure is in the form of a sheet, a gasket, or a three-dimensional body, and is attached to an exothermic plane 101 of electronics. In FIG. 1, A indicates the plane direction of the composite graphite heat emitting material, and B indicates the thickness direction thereof.

Figure 2:
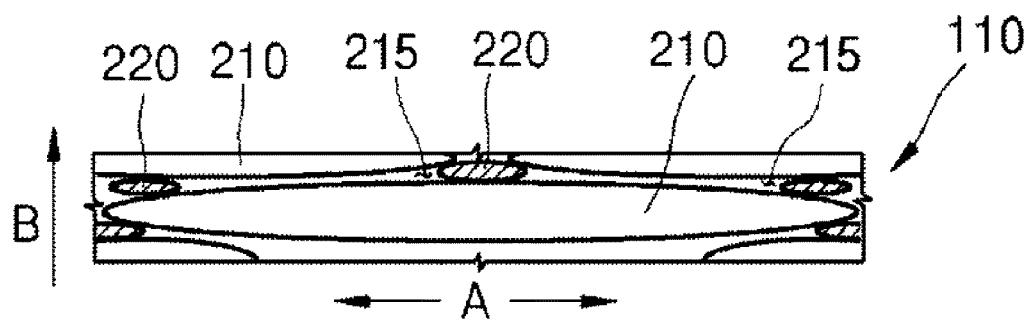
FIG. 2 schematically shows a composite graphite heat emitting material according to one embodiment of the present disclosure.

FIG. 2 schematically shows a composite graphite heat emitting material according to one embodiment of the present disclosure.

Referring to FIG. 2, the composite graphite heat emitting material 110 according to the present disclosure comprises an expanded graphite matrix 210 and high-density expanded and compressed graphite particles 220 charged into pores 215 between particles of the expanded graphite matrix 210.

The expanded graphite matrix 210 is obtained by aligning conventional expanded graphite with a density of about 0.0025 to 0.0125 g/cm$^3$ at a predetermined interval to form a matrix array, and it is finally compressed in the thickness direction of each particle during the compression molding process of the composite graphite heat emitting material 110, as shown in FIG. 2.

The high-density expanded and compressed graphite particles 220 are charged into pores 215 present in the expanded graphite matrix 210.

When the expanded graphite matrix 210 is compressed in the thickness, pores 215 are formed between expanded graphite particles composing the expanded graphite matrix 210, and the pores act as a factor that deteriorates thermal conductivity in the thickness direction. Accordingly, it is known that a conventional heat-emitting material formed by compression molding of expanded graphite exhibits a thermal conductivity of about 230 W/mK or higher in the plane direction (A), but exhibits a thermal conductivity of about 5 W/mK or less in the thickness direction (B). In the present invention, the expanded graphite particles 220, which exhibits the completely same physical and chemical properties as the graphite of the expanded graphite matrix and also is subject to high-density compression, fill pores in the expanded graphite matrix 210, thereby forming a composite structure.

The high-density expanded and compressed graphite particles 220 are charged into pores 215 in the expanded graphite matrix 210 to enhance thermal conductivity in the thickness direction. Particularly, since the high-density expanded and compressed graphite particles 220 are the same graphite component as the material of the matrix 210, they can provide a higher thermal conductivity than cases charging a polymer or other carbon-based particles.

The high-density expanded and compressed graphite particles 220 are obtained by compressing expanded graphite about 8 to 400 times, and they are nearly isotropic graphite. The isotropic graphite has a thermal conductivity of 80 W/mk at a density of 1.75 g/cm$^3$, and 160 W/mk at a density of 1.85 g/cm$^3$. That is, as the density increases, the thermal conductivity is very highly raised.

Considering this matter, the expanded and compressed graphite particles 220 used in the present disclosure are restricted to have a density of 0.1 g/cm$^3$ or more. If the expanded and compressed graphite particles 220 have a density less than 0.1 g/cm$^3$, the effect of enhancing a thermal conductivity in the thickness direction may be insufficient. Meanwhile, in order to produce expanded and compressed graphite particles with an ultra-high density exceeding 2.2 g/cm$^3$, excessive compression should be made and incurs the increase of production costs. Therefore, it is more preferable that the expanded and compressed graphite particles have a density of 0.1 to 2.2 g/cm$^3$.

The high-density expanded and compressed graphite particles are present in an amount of 5 to 50 wt % based on the total weight of the graphite matrix and the high-density expanded and compressed graphite particles. If the high-density expanded and compressed graphite particles are present in an amount less than 5 wt %, pores in the matrix are not sufficiently filled and the effect of enhancing a thermal conductivity in the thickness direction may be poor. If the high-density expanded and compressed graphite particles are preset in an amount exceeding 50 wt %, it is difficult to obtain stable productivity and good reliability.

Meanwhile, it is preferable that the high-density expanded and compressed graphite particles have a diameter of 0.01 to 0.2 μm. If the high-density expanded and compressed graphite particles have a diameter exceeding 0.2 μm, the particles may not enter into pores. If the high-density expanded and compressed graphite particles have a diameter less than 0.01 μm, costs for producing the particles may excessively increase.

The composite graphite heat emitting material according to the present disclosure can minimize pores in the expanded graphite matrix through the high-density expanded and compressed graphite particles, thereby enhancing thermal conductivity in both of plane and thickness directions.

Accordingly, the composite graphite heat emitting material according to the present disclosure can be used as a heat-emitting material for diffusing heat generated from the top of printed circuit boards (PCB) of various electronics, light sources of display devices and the like via direct or indirect contact with a panel and an installation such as a case.

The heat-emitting material that has a structure comprising the expanded graphite matrix being compressed in the thickness direction, and high-density expanded and compressed graphite particles charged into the matrix may be prepared from a composite graphite in which expanded graphite is mixed with expanded and compressed graphite particles with a high density of 0.1 g/cm$^3$ or more.

More specifically, the heat-emitting material of a composite graphite according to the present disclosure may be prepared by compressing expanded graphite 8 to 500 times to obtain expanded and compressed graphite particles with a high density of 0.1 g/cm$^3$ or more, mixing another expanded graphite with the high-density expanded and compressed graphite particles to obtain a graphite mixture, and bringing the mixture into compression molding in the direction of thickness. The compression molding may be carried out under a pressure of about 100 MPa or higher, and three-dimensional process may be made depending on the forms of a mold. Also, the compression molding may be carried out by way of rolling.

EXAMPLES

Hereinafter, various preferred examples of the present disclosure will be described in detail for better understanding of the constitution and function of the present invention. However, the examples of the present disclosure are given for the purpose of illustration only, and should not be interpreted as limiting the scope of the invention. For the matters that can be sufficiently predicted by persons having ordinary skill in the art, the explanation thereof will be omitted.

1. Preparation of Composite Graphite

As shown in Table 1, expanded graphite having a density of 0.008 g/cm$^3$ was mixed with high-density expanded and compressed graphite particles having a density of 1.0 g/cm$^3$.

TABLE 1

|  | Expanded graphite | High-density expanded and compressed graphite |
|---|---|---|
| Example 1 | 95 | 5 |
| Example 2 | 80 | 20 |
| Example 3 | 50 | 50 |
| Comparative Example 1 | 100 | 0 |

Unit: wt %

2. Preparation of Heat-Emitting Material from Composite Graphite

Each of composite graphites prepared in Examples 1 to 3 and Comparative Example 1 was put in a mold and brought into compression molding with a pressure of 200 MPa until a thickness of 1.5 mm can be obtained, to prepare a sheet of composite graphite heat-emitting material.

3. Evaluation of Heat-Emitting Property

Figure 3:
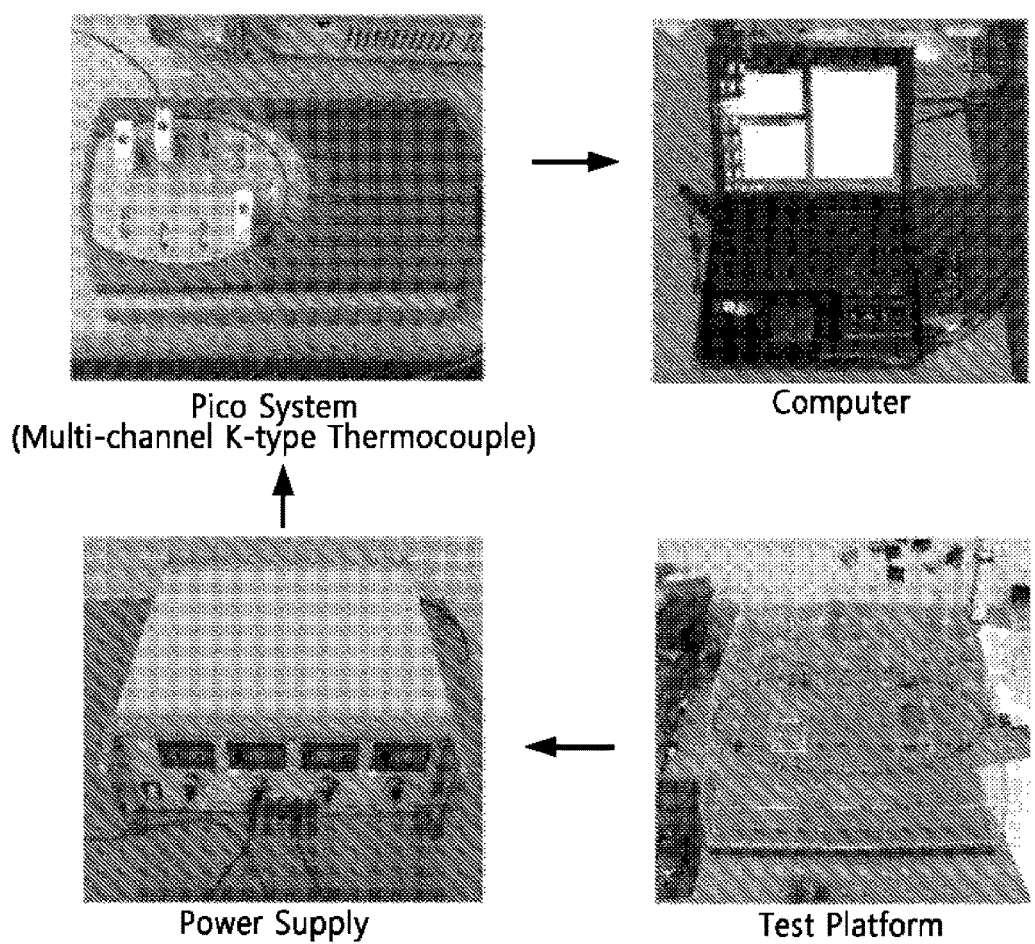
FIG. 3 shows apparatuses for measuring the heat-emitting property of the heat-emitting materials of composite graphites prepared in Examples 1 to 3 and Comparative Example 1.
Figure 4:
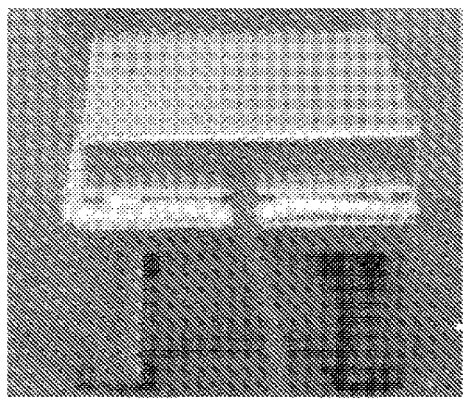
FIG. 4 is expanded views of a heat source disposed in a test platform.
Figure 4:
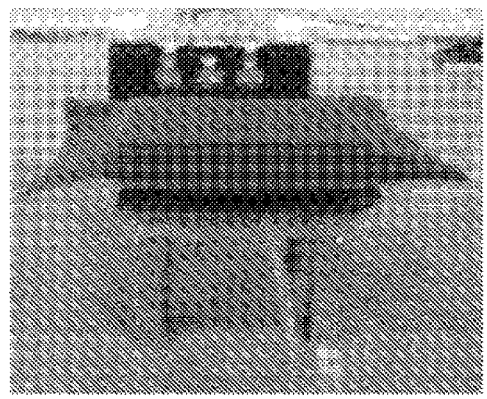

The heat-emitting sheets prepared from composite graphite heat-emitting materials of Examples 1 to 3 and graphite heat-emitting material of Comparative Example 1 were measured for their heat-emitting property with the apparatus shown in FIG. 3. FIG. 4 is expanded views of a heat source disposed in the test platform of FIG. 3.

The test conditions for heat-emitting property are shown in Table 2.

TABLE 2

|  | Conditions |
|---|---|
| Input power | 3.05 W (DC 6.23 V, 0.490 A) |
| Test type | Closed |
| Test time | 3,600 sec |
| Size of heat source | 30 mm × 30 mm × 2.6 mm |
| Size of outer case | 500 mm × 500 mm × 150 mm |
| Size of inner case | 65 mm × 105 mm × 28 mm |
| Space between inner case and heat-emitting material | 2 mm or less |
| Material of case | Acryl |
| Size of heat-emitting material | 50 mm × 50 mm |

The results of heat-emitting property are shown in Table 3.

TABLE 3

| Cooling Effect | 1$^{st}$ Section (500~1,000) sec | 6$^{th}$ Section (3,000~3,600) sec | Retention rate of heat-emitting effect (relative to 1$^{st}$ Section) | Increase and decrease in Retention rate of heat-emitting effect |  |
|---|---|---|---|---|---|
| Comparative Example 1 | 2.30 | 0.09 | 3.91% | 100% (Standard) | — |
| Example 1 | 2.25 | 0.11 | 4.88% | 125% | * |
| Example 2 | 2.28 | 0.15 | 6.57% | 168% | *** |
| Example 3 | 2.32 | 0.17 | 7.33% | 187% | ***** |

Unit: ° C.

As can be seen from Table 3, the heat-emitting material of Comparative Example 1 having no high-density expanded and compressed graphite particles exhibited a retention rate of 3.91% in later (6$^{th}$ section) heat-emitting effect relative to initial (1$^{st}$ section) heat-emitting effect.

In contrast, in the composite graphite heat-emitting materials Examples 1 to 3 with the high-density expanded and compressed graphite particles, later heat-emitting effect were substantially improved as compared with the heat-emitting material of Comparative Example 1. Especially, the later heat-emitting effect of Example 3 was confirmed to increase by 187% relative to that of Comparative Example 1.

The present disclosure has been described in detail. However, it should be understood that the detailed description and specific examples, while indicating preferred embodiments of the disclosure, are given by way of illustration only and are not intended to limit the present disclosure, since various changes and modifications within the spirit and scope of the disclosure will become apparent to those skilled in the art from this detailed description.

EXPLANATION OF REFERENCE NUMERALS

101: Exothermic plane
110: Composite graphite heat emitting material

210: Expanded graphite being compressed in the direction of thickness
215: Pores
220: High-density expanded and compressed graphite

What is claimed is:

1. A composite graphite heat emitting material, comprising
　a matrix of expanded graphite which is expanded graphite with a density of 0.0025 to 0.0125 g/cm$^3$ compressed in the direction of thickness; and
　expanded and compressed high-density graphite particles charged into pores in the matrix and having a density of 1.0 to 2.2 g/cm$^3$,
　wherein the graphite particles are present in an amount of 5 to 50 wt % based on the total weight of the matrix and the graphite particles, and
　wherein the graphite particles have a diameter of 0.01 to 0.2 µm.

2. A method for preparing a composite graphite heat emitting material, comprising:
　(a) compressing expanded graphite to obtain expanded and compressed high-density graphite particles with a density of 1.0 to 2.2 g/cm$^3$;
　(b) mixing another expanded graphite having a density of 0.0025 to 0.0125 g/cm$^3$ with the graphite particles to obtain a composite graphite; and
　(c) bringing the composite graphite into compression molding to form the composite graphite heat emitting material, wherein the composite graphite heat emitting material comprise:
　a matrix of expanded graphite which is the another expanded graphite compressed in the direction of thickness; and
　the graphite particles charged into pores in the matrix, the graphite particles being present in an amount of 5 to 50 wt % based on the total weight of the matrix and the graphite particles, and
　wherein the graphite particles have a diameter of 0.01 to 0.2 µm.

3. The method according to claim 2, wherein step (c) of compression molding is carried out by way of rolling.

\* \* \* \* \*